United States Patent
Atesal et al.

(10) Patent No.: US 10,911,040 B2
(45) Date of Patent: Feb. 2, 2021

(54) HIGH POWER RADIO FREQUENCY SWITCHES WITH LOW LEAKAGE CURRENT AND LOW INSERTION LOSS

(71) Applicant: Analog Devices International Unlimited Company, County Limerick (IE)

(72) Inventors: Yusuf Atesal, Istanbul (TR); Abdullah Celik, Istanbul (TR)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 16/532,932

(22) Filed: Aug. 6, 2019

(65) Prior Publication Data

US 2020/0343884 A1    Oct. 29, 2020

Related U.S. Application Data

(60) Provisional application No. 62/838,549, filed on Apr. 25, 2019.

(51) Int. Cl.
*H03K 17/687* (2006.01)
*H03K 17/06* (2006.01)

(52) U.S. Cl.
CPC ......... *H03K 17/063* (2013.01); *H03K 17/687* (2013.01); *H03K 2017/066* (2013.01); *H03K 2217/0054* (2013.01)

(58) Field of Classification Search
CPC ......... H01L 2924/00; H01L 2924/0002; H03F 3/195; H03F 3/211; H03F 2200/451; H03K 17/063; H03K 17/687; H03K 2217/0054; H03K 2217/066
See application file for complete search history.

(56) References Cited

U.S. PATENT DOCUMENTS

| | | | |
|---|---|---|---|
| 8,229,367 B2 | 7/2012 | Chan et al. | |
| 8,948,709 B2 | 2/2015 | Kwok et al. | |
| 9,484,977 B2 | 11/2016 | Anderson et al. | |
| 9,780,828 B2 | 10/2017 | Afsahi et al. | |
| 10,581,478 B1 * | 3/2020 | Tam | H03F 3/191 |
| 2006/0084392 A1 | 4/2006 | Marholev et al. | |
| 2011/0158134 A1 | 6/2011 | Mikhemar et al. | |

(Continued)

FOREIGN PATENT DOCUMENTS

CN    106487402 A    3/2017

OTHER PUBLICATIONS

Lee, Kyeong-Hyeok, et al. "A 25-30-GHz asymmetric SPDT switch for 5G applications in 65-nm triple-well CMOS." *IEEE Microwave and Wireless Components Letters* 29.6 (2019): 391-393.

(Continued)

*Primary Examiner* — Sibin Chen
(74) *Attorney, Agent, or Firm* — Knobbe, Martens, Olson & Bear, LLP

(57) ABSTRACT

High power radio frequency (RF) switches with low leakage current and low insertion loss are provided. In one embodiment, an RF switch includes a plurality of transistors and is configured to selectively connect one of a transmit path or a receive path to an antenna. All of the transistors are configured to be in an on state when the RF switch operates in a high power mode and all of the transistors are configured to be in an off state when the RF switch operates in a low power mode.

20 Claims, 6 Drawing Sheets

(56) References Cited

U.S. PATENT DOCUMENTS

| | | |
|---|---|---|
| 2011/0281527 A1 | 11/2011 | Chiang et al. |
| 2015/0094117 A1 | 4/2015 | Conta et al. |
| 2017/0019135 A1 | 1/2017 | Kwok et al. |

OTHER PUBLICATIONS

Wang, Y., H. Wang, C. Hull, and S. Ravid, "A Transformer-Based Broadband Front-End Combo in Standard CMOS," in *IEEE Journal of Solid-State Circuits*, vol. 47, No. 8, pp. 1810-1819, Aug. 2012.

\* cited by examiner

HIGH POWER RADIO FREQUENCY SWITCHES WITH LOW LEAKAGE CURRENT AND LOW INSERTION LOSS

CROSS-REFERENCE TO RELATED APPLICATIONS

The present application claims priority to U.S. Provisional Patent Application No. 62/838,549, filed Apr. 25, 2019, and titled "HIGH POWER RADIO FREQUENCY SWITCHES WITH LOW LEAKAGE CURRENT AND LOW INSERTION LOSS," the entirety of which is hereby incorporated herein by reference.

FIELD OF THE DISCLOSURE

Embodiments of the invention relate to electronic systems, and more particularly, to transmit/receive radio frequency switches.

BACKGROUND

A radio frequency (RF) communication system can include RF switches used for a variety of purposes.

In one example, an RF communication system can include a radio frequency transmit/receive switch. The transmit/receive switch can be used to electrically connect an antenna to a transmit path or a receive path of the system, thereby allowing each of the transmit and receive paths access the antenna.

SUMMARY OF THE DISCLOSURE

High power radio frequency switches with low leakage current and low insertion loss are provided herein. In certain embodiments, a switch may include a plurality of stacked transistors in order to prevent leakage currents and/or transistor breakdown from occurring. These stacks of transistors may increase the insertion loss of the switch when operating in a lower power receive mode. The insertion loss can be reduced by increasing the channel width of the transistors used in the stack, however, this may result in a trade-off of limiting the bandwidth achievable by the switch. Certain embodiments of this disclosure provide a switch design that reduces the number of transistors which would be in an off state when the switch operated in a high power mode and reduces the number of transistors that would be in an on state when the RF switch operates in a low power mode. By designing a switch in this way, the insertion loss of the switch can be reduced without limiting the bandwidth of the switch to the same extent as increasing the channel width of the transistors.

In one aspect, a radio frequency (RF) system with low switch insertion loss is provided. The RF system includes an antenna, a transmit path configured to generate a transmit signal for the antenna, a receive path configured to process a receive signal from the antenna, and an RF switch comprising a plurality of transistors and operable in a first mode and a second mode. The RF switch is configured to provide the receive signal from the antenna to the receive path in the second mode. All of the transistors are configured to be in an on state when the RF switch operates in the first mode and all of the transistors are configured to be in an off state when the RF switch operates in the second mode.

In another aspect, a radio frequency (RF) switch with low insertion loss is provided. The RF switch includes a plurality of terminals including an antenna terminal, a receive terminal, and a transmit terminal, and a plurality of transistors that are controllable to set the RF switch in a first mode or a second mode. The RF switch is configured to connect the transmit terminal to the antenna terminal in the first mode, and to connect the antenna terminal to the receive terminal in the second mode. All of the transistors are configured to be in an on state when the RF switch operates in the first mode and all of the transistors are configured to be in an off state when the RF switch operates in the second mode.

In yet another aspect, a method of controlling a radio frequency (RF) switch to provide low insertion loss is provided. The method includes selectively connecting one of a transmit path or a receive path to an antenna using an RF switch, the RF switch comprising a plurality of transistors, controlling all of the transistors to be in an on state when the RF switch operates in a high power mode, and controlling all of the transistors to be in an off state when the RF switch operates in a low power mode.

DETAILED DESCRIPTION OF EMBODIMENTS

Figure 1:
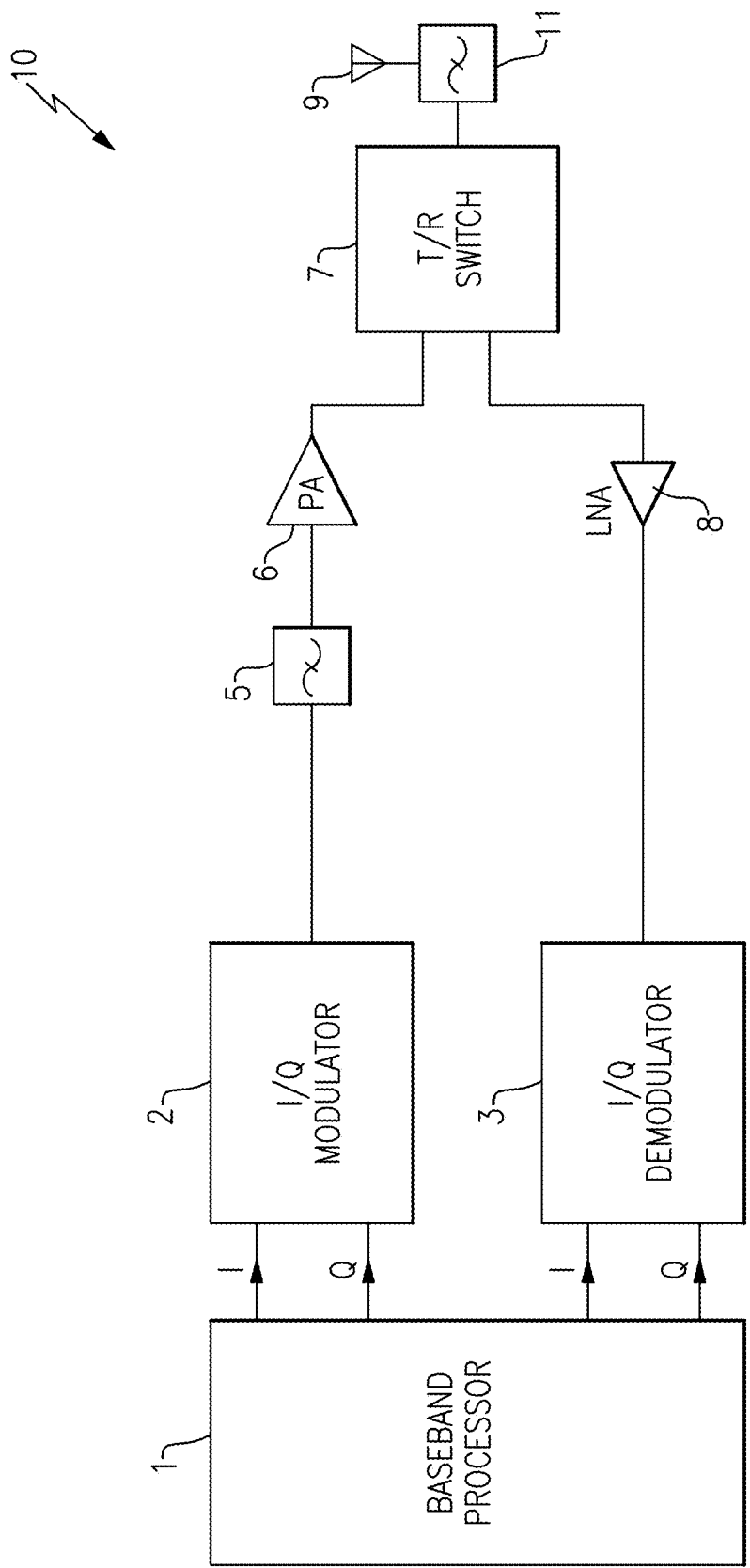
FIG. 1 is a schematic diagram of one example of a radio frequency (RF) system that can include one or more RF switching circuits in accordance with the teachings herein.

The following detailed description of embodiments presents various descriptions of specific embodiments of the invention. In this description, reference is made to the drawings in which like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

A radio frequency (RF) communication system communicates by wirelessly transmitting and receiving RF signals. Such RF communication systems can include one or more RF switches to provide control over routing of RF signals, connectivity between components or circuits, and/or to provide various other switching functions. Examples of RF communication systems with one or more RF switches include, but are not limited to, base stations, mobile devices (for instance, smartphones or handsets), laptop computers, tablets, Internet of Things (IoT) devices, and/or wearable electronics.

An RF communication system can include a transmit/receive (T/R) switch for electrically connecting an antenna to a transmit path or a receive path of the system. When the RF communication system is transmitting, a high power transmit signal can be provided to an antenna through a transmit branch of the T/R switch while a receive branch of the T/R switch is turned off. Additionally, when the RF communication system is receiving, a low power receive signal can be received from the antenna through the receive branch while the transmit branch is turned off.

In order to operate in a high power mode when transmitting RF signals and in a lower power mode when receiving signals, an RF switch may include a series of stacked transistors to prevent leakage current from flowing to the receive path in the high power mode. For example, in the context of a T/R switch, the receive branch and transmit branch can each include a stack of field-effect transistors (FETs) for enhanced power handling capability. However, these stacked transistors can increase insertion loss experienced in low power mode, reducing the overall bandwidth of the RF switch.

Aspects of this disclosure relate to RF switches that can have a reduced insertion loss by reducing the number of stacked transistors or eliminating transistor stacks altogether.

FIG. 1 is a schematic diagram of one example of an RF communication system 10 that can include one or more RF switching circuits in accordance with the teachings herein.

Although, the RF communication system 10 illustrates one example of an electronic system that can include one or more RF switching circuits as described herein, RF switching circuits can be used in other configurations of electronic systems.

Furthermore, although a particular configuration of components is illustrated in FIG. 1, the RF communication system 10 can be adapted and modified in a wide variety of ways. For example, the RF communication system 10 can include more or fewer receive paths and/or transmit paths. Additionally, the RF communication system 10 can be modified to include more or fewer components and/or a different arrangement of components, including, for example, a different arrangement of RF switching circuits.

In the illustrated configuration, the RF communication system 10 includes a baseband processor 1, an I/Q modulator 2, an I/Q demodulator 3, a first filter 5, a power amplifier 6, a transmit/receive switch 7, a low noise amplifier (LNA) 8, an antenna 9, and a second filter 11.

As shown in FIG. 1, baseband processor 1 generates an in-phase (I) transmit signal and a quadrature-phase (Q) transmit signal, which are provided to the I/Q modulator 2. Additionally, the baseband processor 1 receives an I receive signal and a Q receive signal from the I/Q demodulator 3. The I and Q transmit signals correspond to signal components of a transmit signal of a particular amplitude, frequency, and phase. For example, the I transmit signal and Q transmit signal represent an in-phase sinusoidal component and quadrature-phase sinusoidal component, respectively, and can be an equivalent representation of the transmit signal. Additionally, the I and Q receive signals correspond to signal components of a receive signal of a particular amplitude, frequency, and phase.

In certain implementations, the I transmit signal, the Q transmit signal, the I receive signal, and the Q receive signal are digital signals. Additionally, the baseband processor 1 can include a digital signal processor, a microprocessor, or a combination thereof, used for processing the digital signals.

The I/Q modulator 2 receives the I and Q transmit signals from the baseband processor 1 and processes them to generate a modulated RF signal. In certain configurations, the I/Q modulator 2 can include DACs configured to convert the I and Q transmit signals into an analog format, mixers for upconverting the I and Q transmit signals to radio frequency, and a signal combiner for combining the upconverted I and Q signals into the modulated RF signal.

The first filter 5 receives the modulated RF signal from the I/Q modulator 2, and provides a filtered RF signal to an input of the power amplifier 6. In certain configurations, the first filter 5 can be a band pass filter configured to provide band filtering. However, the first filter 5 can be a low pass filter, a band pass filter, a notch filter, a high pass filter, or a combination thereof, depending on the application.

The power amplifier 6 can amplify the filtered RF signal to generate an amplified RF signal, which is provided to the transmit/receive switch 7. The transmit/receive switch 7 is further electrically connected to the second filter 11 and to an input of the low noise amplifier 8. The second filter 11 is connected to the antenna 9. Thus, in this example, the power amplifier 6 provides the amplified RF signal to the antenna 9 by way of the transmit/receive switch 7 and the second filter 11. However, other implementations are possible, such as configurations in which the second filter 11 is omitted.

In certain configurations, the second filter 11 can be a band pass filter configured to provide band filtering. However, the second filter 11 can be a low pass filter, a band pass filter, a notch filter, a high pass filter, or a combination thereof, depending on the application.

The transmit/receive switch 7 can be used to selectively connect the antenna 9 (via the second filter 11) to the output of the power amplifier 6 or to the input of the low noise amplifier 8. In certain implementations, the transmit/receive switch 7 can provide a number of other functionalities, including, but not limited to, band switching and/or switching between different power modes.

The LNA 8 receives an antenna receive signal from the transmit/receive switch 7, and generates an amplified antenna receive signal that is provided to the I/Q demodulator 3. The I/Q demodulator 3 can be used to generate the I receive signal and the Q receive signal, as was descried above. In certain configurations, the I/Q demodulator 3 can include a pair of mixers for mixing the attenuated receive signal with a pair of clock signals that are about ninety degrees out of phase. Additionally, the mixers can generate downconverted signals, which can be provided to ADCs used to generate the I and Q receive signals.

Figure 2A:
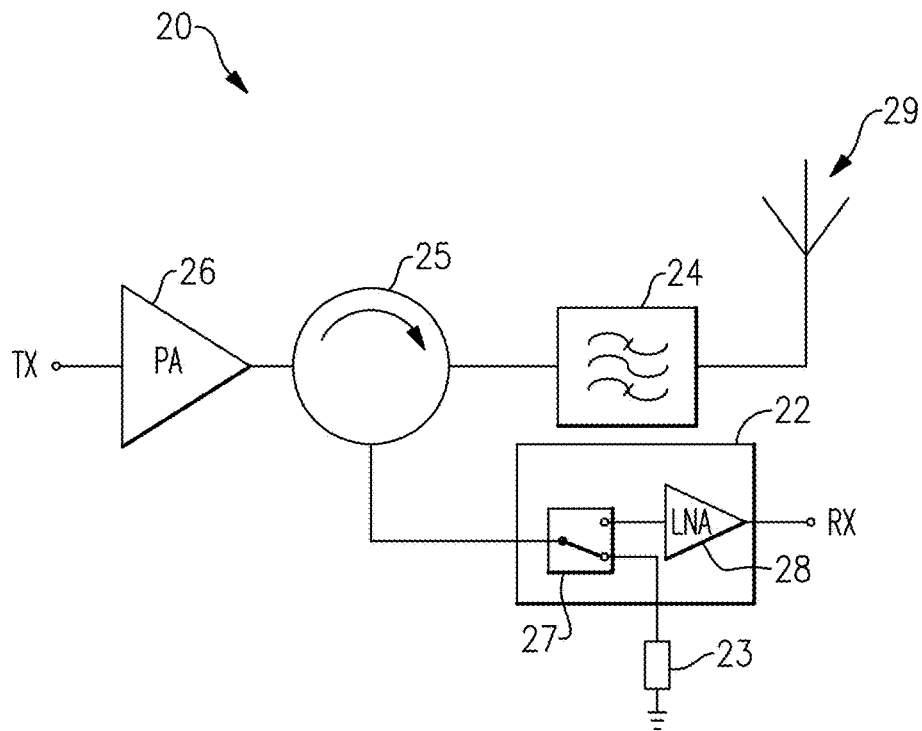
FIG. 2A is a schematic diagram of one example of a portion of an RF system that can include a transmit/receive switch that can be used as a protection switch in accordance with the teachings herein.

FIG. 2A is a schematic diagram of one example of a portion of an RF system that can include a transmit/receive switch that can be used as a protection switch in accordance with the teachings herein.

As shown in FIG. 2A, the RF system 20 includes a power amplifier 26, a circulator 25, a filter 24, an antenna 29, a transmit/receive switch chip 22, and an impedance element 23. The power amplifier 26 can receive a transmit RF signal from a transmit terminal TX (e.g., from the I/Q modulator 2 or first filter 5 of FIG. 1) and amplify the received RF signal to generate an amplified RF signal.

The circulator 25 provides a point of electrical connection between the power amplifier 26, the filter 24, and the transmit/receive switch chip 22. For example, the circulator 25 serves in providing the power amplifier 26 and the transmit/receive switch chip 22 shared access to the antenna 29. The circulator 25 includes a transmit port connected to an output of the power amplifier 26, a receive port connected to the transmit/receive switch chip 22, and an antenna terminal connected to the antenna 29 by way of the filter 24.

Although an example with a circulator is shown, other implementations are possible. In one example, the circulator 25 is omitted in favor of including a switch configured to connect the antenna 29 to the transmit path when the RF system 20 is operating in an RF transmission mode and connect the antenna 29 to the receive path when the RF system 20 is operating in an RF receive mode. In another example, the circulator 25 is omitted in favor of including a duplexer or other suitable frequency multiplexing structure.

In the illustrated embodiment, the filter 24 is connected between the circulator 25 and the antenna 29. In certain configurations, the filter 24 can be a band pass filter configured to provide band filtering. However, the filter 24 can be a low pass filter, a band pass filter, a notch filter, a high pass filter, or a combination thereof, depending on the application.

The transmit/receive chip 22 includes a transmit/receive switch 27 and an LNA 28, in this embodiment. A chip, such as the transmit/receive chip 22 of FIG. 2A, is also referred to herein as a semiconductor die or integrated circuit (IC). Although a specific combination of components is shown on the transmit/receive chip 22, more or fewer components can be included on the chip 22. For instance, in another example the transmit/receive switch 27 and the LNA 28 are manufactured on separate chips. In certain implementations, the transmit/receive chip 22 includes a chip interface, such as a serial bus, that receives data for controlling a state or mode of the transmit/receive switch 27.

In some embodiments, transmit/receive chip 22 may be manufactured on a multi-chip-module (MCM). For example, the MCM can include a module substrate on which the transmit/receive chip 22 is attached. In such implementations, the impedance element 23 and/or other components of RF system 20 can be included on the MCM.

The transmit/receive switch 27 is operable to selectively connect one of an input of the LNA 28 or the impedance element 23 to the circulator 25. The LNA 8 receives an antenna receive signal from the transmit/receive switch 27, and generates an amplified antenna receive signal that is provided to a receive terminal RX (e.g., to the I/Q demodulator 3 of FIG. 1).

In certain embodiments, the transmit/receive switch 27 is configured to connect the LNA 28 to the circulator 25 when the RF system 20 is in a receive mode (e.g., receiving a low power RF signal through the antenna 29) and connect the circulator 25 to ground through the impedance element 23 when the RF system 20 is in a transmit mode (e.g., transmitting a high power RF signal through the antenna 29). Connecting the circulator 25 to ground through the impedance element 23 when the RF system 20 is in a transmit mode enhances isolation relative to an implementation in which the input of the LNA 28 is directly connected to the circulator 25.

The amount of power transmitted to the antenna 29 in the transmit mode may be significantly higher than the amount of power received via the antenna 29 in the receive mode. For example, the antenna may be designed to communicate with a base station that is remote from the RF system 20. In order to provide a wireless signal to a base station, the power amplifier 26 may amplify the received RF signal to generate an amplified RF signal of sufficient power to reach the base station. In contrast, when receiving an RF signal from a base station, the RF signal may have lost a large portion of the original transmit power, for instance, due to the inverse-square law and/or path losses.

Thus, the RF signal received at the LNA 28 may be of significantly lower power than the amplified RF signal generated by the power amplifier 26. In other embodiments, the RF system 20 may be included as a part of a base station configured to communicate with one or more wireless receivers (e.g., cellular phones, etc.). In these embodiments, the RF system 20 may similarly operating using high power mode in a transmit mode and low power in a receive mode for substantially the same reasons.

The LNA 28 may not be configured to handle a signal having the power of the amplified RF signal generated by the power amplifier 26. In some embodiments, receiving a signal at a power level of the amplified RF signal may damage components (e.g., the LNA 28) along the receive path. Thus, in the high power transmit mode, the transmit/receive switch 27 may shunt any signal leaked through the circulator 25 onto the receive path to ground through the impedance element 23. By providing the shunt path to ground, the transmit/receive switch 27 can protect the LNA 28 and other components along the receive path (e.g., downstream from the receive terminal RX) from leakage of the amplified RF signal that reaches the receive path.

When the transmit/receive chip 22 is configured as an LNA 28 protection switch as in the embodiment of FIG. 2A, the RF system 20 may be able to handle high power amplified RF signals generated by the power amplifier 26 while also providing low insertion loss when operating in a low power receive mode. This can produce a low receive noise figure when receiving RF signals through the antenna 29.

Figure 2B:
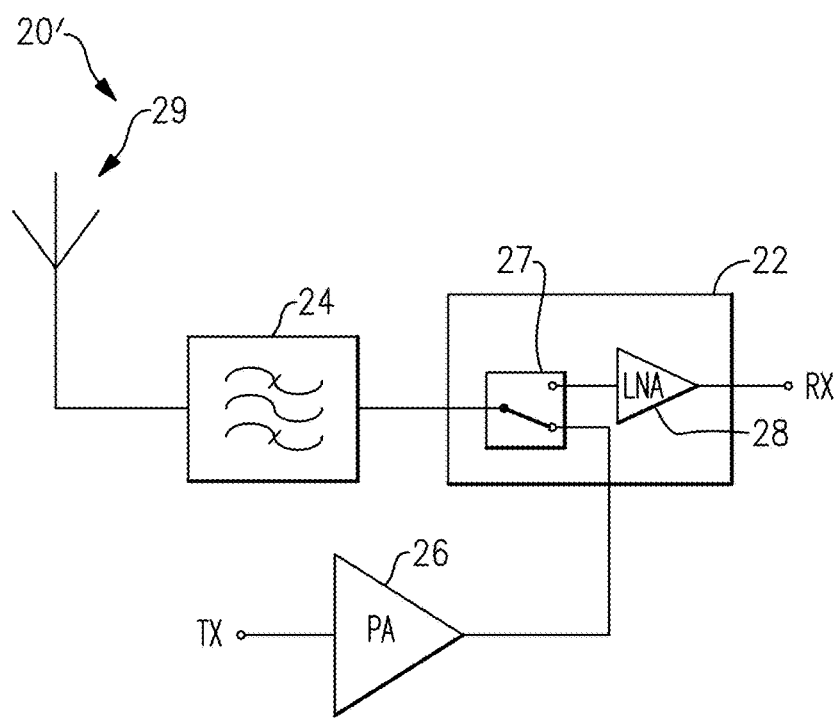
FIG. 2B is a schematic diagram of another example of a portion of an RF system that can include a transmit/receive switch in accordance with the teachings herein.

FIG. 2B is a schematic diagram of another example of a portion of an RF system that can include a transmit/receive switch in accordance with the teachings herein.

As shown in FIG. 2B, the RF system 20' includes an antenna 29, a filter 24, a transmit/receive switch chip 22, and a power amplifier 26. Each of the antenna 29, the filter 24, and the power amplifier 26 may function in a substantially similar fashion to the corresponding components of the FIG. 2A embodiment.

In the illustrated embodiment, the transmit/receive switch 27 is configured to connect the antenna 29 to the power amplifier 26 when the RF system 20' operates in a transmit mode and connect the antenna 29 to the LNA 28 when the RF system 20' operates in a receive mode.

Thus, the transmit/receive switch 27 can prevent the amplified RF signal generated by the power amplifier 26 from being connected to the receive path in the transmit mode. The embodiment of FIG. 2B can also handle high power amplified RF signals generated by the power amplifier 26 while providing low insertion loss when operating in a low power receive mode. This configuration can thus provide a low receive noise figure when receiving RF signals through the antenna 29.

Due to the power differential between the amplified RF signal generated by the power amplifier and the received RF signal received from the antenna 29 in each of FIGS. 2A and 2B, it may not be practical to implement the transmit/receive switch 27 by a single transistor in the transmit branch and a single transistor in the receive branch. That is, RF switch transistors may have limited voltage handling, resulting in breakdown when a single transistor is used in the transmit branch or receive branch.

In a first example, a transmit/receive switch and include metal oxide semiconductor (MOS) transistors that can suffer from gate oxide breakdown in the presence of high power RF signals. By including multiple MOS transistors in a stack, RF power handling capability can be increased. In another example, during breakdown, when a reverse voltage is applied between the drain and source of the RF transistor is greater than a threshold breakdown voltage, a leakage current may flow between the source and drain of the transistor. This leakage current may thus flow to the LNA 28, thereby damaging the LNA 28 when the voltage of the leakage current is greater than a threshold voltage. In order to reduce or prevent such a leakage current from occurring, a plurality of RF switch transistors may be stacked, thereby increasing the voltage that can be handled by the transmit/receive switch before a leakage current reaches the LNA 28.

Figure 3:
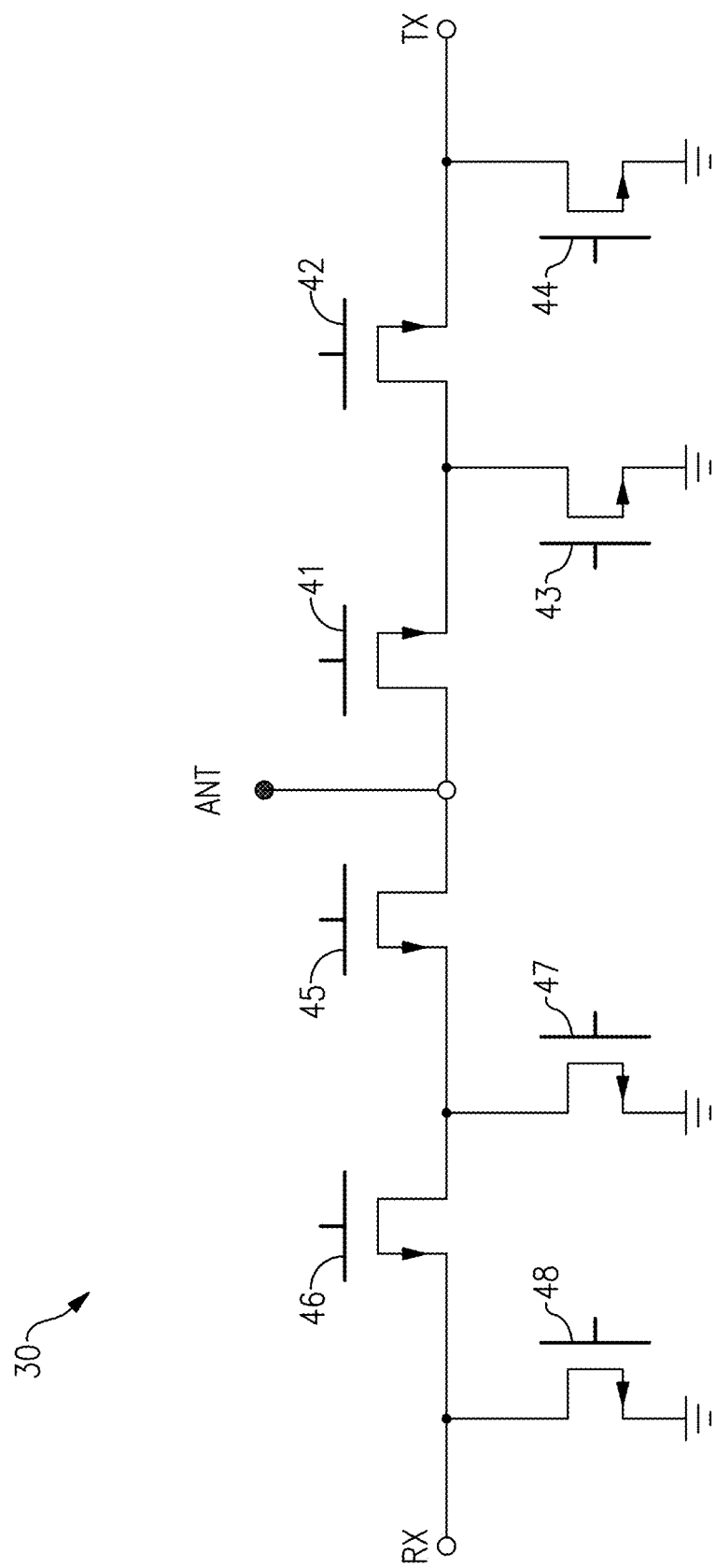
FIG. 3 illustrates one example implementation of a transmit/receive switch that can be used in the RF systems illustrated in FIGS. 1, 2A, and 2B.

FIG. 3 illustrates one example implementation of a transmit/receive switch that can be used in the RF systems illustrated in FIGS. 1, 2A, and 2B. The transmit/receive switch 300 includes an antenna terminal ANT, a receive terminal RX, and a transmit terminal TX. The transmit/receive switch 300 further includes a plurality of transistors 41-48 stacked to prevent leakage current(s) and/or transistor breakdown from occurring in the transmit/receive switch 30.

The antenna terminal ANT may be connected to an antenna (e.g., the antenna 29 of FIGS. 2A and 2B via a filter 24), the receive terminal RX may be connected to an LNA (e.g., the LNA 28) to be connected to a receive path, and the transmit terminal TX may be connected to a power amplifier (e.g., the power amplifier 26) to be connected to a transmit path.

With continued reference to FIG. 3, the transmit/receive switch 30 includes a pair of series stack transistors 41 and 42 and a pair of shunt stack transistors 43 and 44 electrically connected between the antenna terminal ANT and the transmit terminal TX. Similarly, the transmit/receive switch 30 further includes a pair of series stack transistors 45 and 46 and a pair of shunt stack transistors 47 and 48 electrically connected between the antenna terminal ANT and the receive terminal RX.

Although a pair of series stack transistors and a pair of shunt stack transistors are formed on each of the transmit and receive paths in FIG. 3, a greater number of transistors can be stacked on each of the transmit and receive paths in order to increase the voltage that can be transmitted prior to generating leakage current.

The series stack transistors 41, 42, 45 and 46 are configured to connect one of the transmit or receive terminals TX and RX to the antenna terminal ANT, while the shunt stack transistors 44, 45, 48 and 47 are configured to shunt leakage currents to ground. For example, in a high power transmit mode, series stack transistors 41 and 42 along with shunt stack transistors 47 and 48 are turned on, while series stack transistors 45 and 46 along with shunt stack transistors 43 and 44 are turned off. In this way, the transmit terminal TX can be electrically connected to the antenna terminal ANT via series stack transistors 41 and 42 and electrically isolated from ground via shunt stack transistors 43 and 44.

The receive terminal RX can be electrically isolated from the antenna terminal ANT via series stack transistors 45 and 46 and each of the series stack transistors 45 and 46 is also connected to ground via shunt stack transistors 47 and 48. In this way, any leakage current flowing through the series stack transistors 45 and 46 due to the high power RF signal provided by the transmit terminal TX can be shunted to ground through the shunt stack transistors 47 and 48 before reaching the receive terminal RX.

In one example, the high power RF signal may have a voltage of about 100 V. Thus, 24 stacks of transistors may be provided on each of the transmit and receive paths of the transmit/receive switch 30. Each of the transistors 41-48 may have a breakdown voltage (for instance, a maximum drain-to-source voltage, or Vds-max) of about 4 V.

Thus, by providing 24 series stack transistors 45 and 46 between the antenna terminal ANT and the receiver terminal RX, any leakage current through the series of stacked transistors may be reduced to a voltage level that does not damage components on the receive path (e.g., an LNA 28). However, as discussed above, the stack of transistors may increase the overall on resistance $R_{ON}$ of the transmit/receive switch 30, thereby increasing insertion loss when operating in the low power receive mode.

The voltage handling and breakdown capabilities of the transmit/receive switch 30 may be related to the following RF switch parameters: on resistance ($R_{ON}$), off capacitance ($C_{OFF}$), and drain-to-source breakdown voltage (Vds-max). As the number of stacked RF transistors increases the overall resistance $R_{ON}$ of the transmit/receive switch 30 increases for each additional RF transistor, leading to more insertion loss.

To reduce the insertion loss of the transmit/receive switch 30, the width of the channel for the transistors used as the RF transistors can be increased. However, this may limit the bandwidth achievable by the transmit/receive switch 30. Although not illustrated, in some embodiments, each of the transistors 41-48 may be biased by a resistor connect to the transistor's 41-48 gate, which may be parasitically coupled to the transistor's 41-48 channel (e.g., via parasitic capacitive coupling).

Increasing the number of transistors 41-48 stacked in the transmit/receive switch 30 also increases losses due to this coupling, increasing the loss of the transmit/receive switch 30. Moreover, when using wider channel transistors 41-48 a lower resistance may be selected for the biasing resistors, which can also increase the coupling loss.

Aspects of this disclosure relate to a transmit/receive switch which can address at least some of the above drawbacks to a stacked transistor transmit/receive switch. These problems can be address in certain embodiments by designing a transmit/receive switch based on at least some of the following considerations.

One consideration is to limit or remove transistors which would be in an off state when the RF switch operates in a high power mode (e.g., in the RF transmit mode). For example, this can be achieved by a configuration in which all switches are turned on when high power is transmitted through the transmit/receive switch. By designing the transmit/receive switch based on this consideration, the number of stacked transistors can be reduced since the transistors have a drain to source voltage drop Vds of about 0 V when turned on.

Another consideration is to limit or remove transistors which would be in an on state when the RF switch operates in a low power mode (e.g., in the RF receive mode). For example, this can be achieved by a configuration in which all switches are turned off when low power is transmitted through the transmit/receive switch. By designing the transmit/receive switch based on this consideration, the insertion loss of the transmit/receive switch can be reduced since each transistor that the RF signal must be transmitted through (e.g., transistors that are switched on) contributes to insertion loss. Designing for this consideration can therefor improve the noise figure of the transmit/receive switch.

Figure 4A:
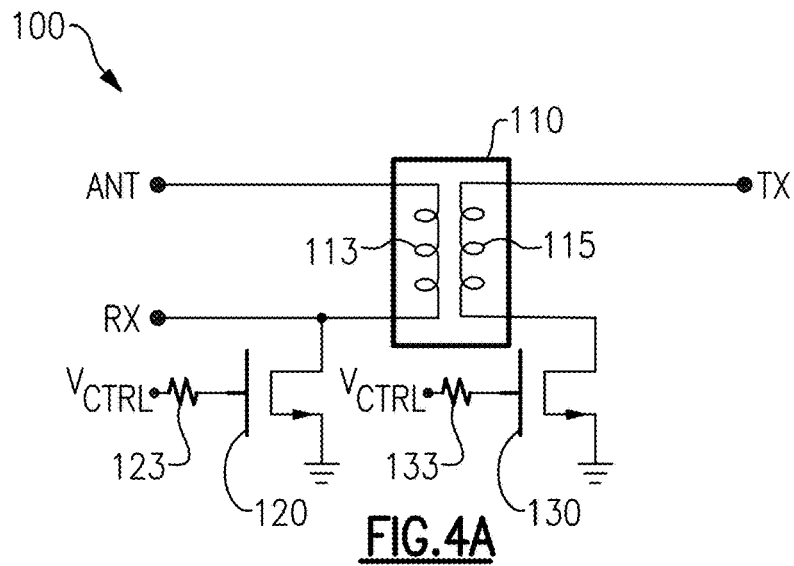
FIG. 4A illustrates another example implementation of a transmit/receive switch that can be used in the RF systems illustrated in FIGS. 1, 2A, and 2B in accordance with the teachings herein.
Figure 4B:
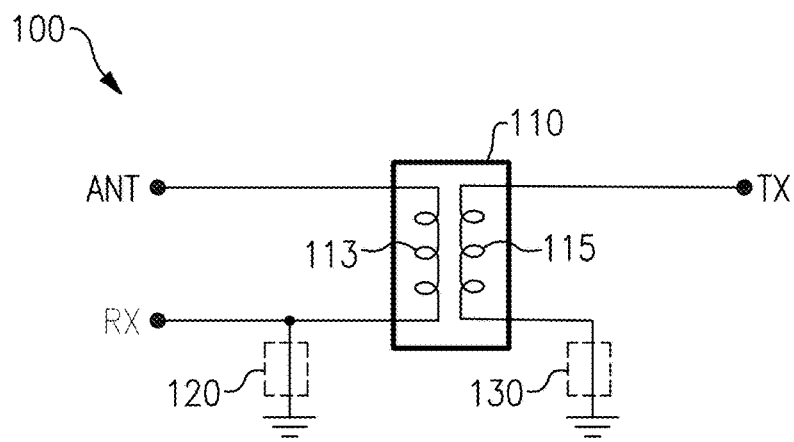
FIG. 4B illustrates the transmit/receive switch of FIG. 4A in a first mode.
Figure 4C:
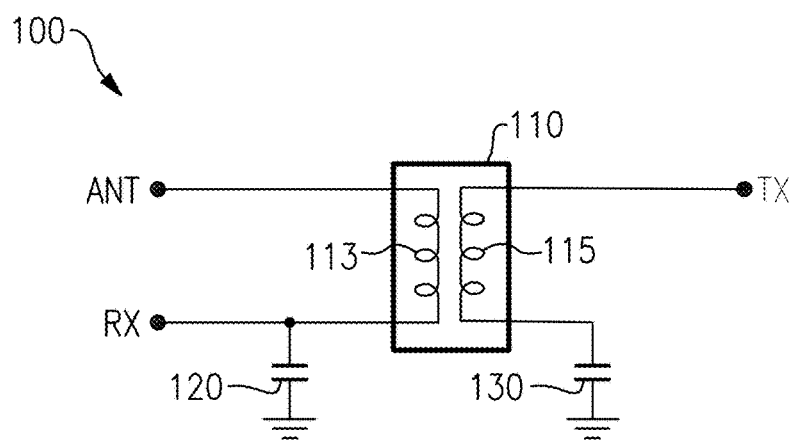
FIG. 4C illustrates the transmit/receive switch of FIG. 4A in a second mode.

FIGS. 4A-4C illustrate another example implementation of a transmit/receive switch 100 that can be used in the RF systems illustrated in FIGS. 1, 2A, and 2B in accordance with the teachings herein. Although the RF systems of FIGS. 1, 2A, and 2B illustrate examples of RF systems that can include one or more instantiations of the transmit/receive switch 100, the teachings herein are applicable to other configurations of RF systems.

With reference to FIG. 4A, the transmit/receive switch 100 includes an antenna terminal ANT, a transmit terminal TX, a receive terminal RX, a balun 110, a first transistor 120, and a second transistor 130. The transmit/receive switch 100 further includes a first resistor 123 and a second resistor 133.

In the illustrated embodiment, the balun 110 includes a first loop 113 electrically connected between the antenna terminal ANT and the receive terminal RX, and a second loop 115 electrically connected between the transmit terminal TX and the second transistor 130 which is connected to a reference voltage (ground, in this example). Thus, a first end of the first loop 113 is connected to the antenna terminal ANT, while a second end of the first loop 113 is connected to both the receive terminal RX and a drain of the first transistor 120. Additionally, a first end of the second loop 115 is connected to the transmit terminal TX, while a second end of the second loop 115 is connected to a drain of the second transistor 130.

Although depicted as including a single transistor between the second end of the first loop 113 and ground and a single transistor between the second end of the second loop 113 and ground, additional transistors can be included. For example, two or more transistors can be included in series between the second end of the first loop 113 and ground and/or two or more transistors can be included in series between the second end of the second loop 115 and ground.

The first loop 113 and the second loop 115 are coupled to one another, for instance, negatively coupled magnetically. In certain implementations, the first loop 113 and the second loop 115 are each implemented as transmission lines on a chip that are tightly spaced to provide electromagnetic coupling of both magnetic and electric fields. A balun's loops are also referred to herein as sections or windings.

Thus, the first and second loops 113 and 115 of the balun 110 are electrically coupled such that when an RF signal is transmitted through the first loop 113 a corresponding RF signal can be induced through the second loop 115, and vice versa. The signals provided to or received from the illustrated terminals and handled by the balun 110 can be of a wide range of frequencies. Since the balun 100 can operate over multiple decades of frequency, the transmit/receive switch 100 can also operate with wide bandwidth.

For example, the balun 110 can handle not only RF signals between 100 MHz and 7 GHz, but also signals of higher frequencies, such as those in the X band (about 7 GHz to 12 GHz), the $K_u$ band (about 12 GHz to 18 GHz), the K band (about 18 GHz to 27 GHz), the $K_a$ band (about 27 GHz to 40 GHz), the V band (about 40 GHz to 75 GHz), and/or the W band (about 75 GHz to 110 GHz). Accordingly, the teachings herein are applicable to a wide variety of RF systems, including microwave systems.

The first transistor 120 is configured to selectively connect the receive terminal RX and the first loop 113 to ground based on a control signal $V_{CTRL}$ received through the first resistor 123. Similarly, the second transistor 130 is configured to selectively connect the second loop 115 to ground based on a control signal $V_{CTRL}$ received through the second resistor 133.

In certain implementations, the first transistor 120 and the second transistor 130 are implemented as metal oxide semiconductor (MOS) transistors, such as n-type metal oxide semiconductor (NMOS) transistors. Additionally, a gate of the first transistor 120 and a gate of the second transistor 130 are controlled using a common control signal $V_{CTRL}$ from a control circuit (not shown in FIG. 4A). In such implementations, complexity of signaling of the transmit/receive switch 100 is reduced relative to implementation in which multiple control signals are used, such as pairs of logically inverted control signals.

In certain implementations, the first transistor 120 and the second transistor 130 are turned on or off based on data received over a chip interface. For example, the transmit/receive switch 100 can be fabricated on a semiconductor die that includes a serial bus that receives data for controlling the mode of the transmit/receive switch 100.

FIG. 4B illustrates the transmit/receive switch 100 when configured in a high power mode (e.g., RF transmit mode). As shown in FIG. 4B, each of the first and second transistors 120 and 130 is turned on in the high power mode, effectively connecting the first and second loops 113 and 115 to ground. Although the first and second transistors 120 and 130 are illustrated as being shorted to ground, in some embodiments, the first and second transistors 120 and 130 may still have a resistance $R_{ON}$ when turned on.

In particular, turning on the first transistor 120 and the second transistor 130 results in the transmit terminal TX being connected to ground through the second loop 115 and the antenna terminal ANT being connected to ground through the first loop 113. Since the first loop 113 and the second loop 115 are grounded, the balun 110 operates as a transformer that induces an RF signal in the first loop 113 in response to a transmit signal received at the transmit terminal TX. As shown in FIG. 4B, the induced RF signal is provided to the antenna terminal ANT.

When operating in the high power mode, the receive terminal RX is grounded by the first transistor 120, thereby providing high isolation. Thus, the RF signal induced in the first loop 113 does not flow to the receive terminal RX.

Since all of the transistors 120 and 130 in the high power mode are in an on state, a fewer number transistor 120 and 130 stacks are required in comparison to the embodiment of FIG. 3. With fewer stacked transistors 120 and 130, the insertion loss when operating in low power receive mode can be reduced. In addition, wide channel transistors need not be used to address insertion loss, thereby increasing the bandwidth of the transmit/receive switch 100.

FIG. 4C illustrates the transmit/receive switch 100 when configured in a low power mode (e.g., RF receive mode). As shown in FIG. 4C, each of the first and second transistors 120 and 130 is turned off in the low power mode, effectively electrically isolating the first and second loops 113 and 115 from ground. The amount of electrical isolation provided by the first and second transistors 120 and 130 may be a function of the off capacitance CUFF of the first and second transistors 120 and 130.

In particular, the second loop 115 is electrically isolated from ground such that current is not induced in the second loop 115. For example, by providing high impedance between the second end of the second coil 115 and ground, transfer of energy from the first coil 113 to the second coil 115 is inhibited.

The first loop 113 is also electrically isolated from ground such that the RF signal received from the antenna ANT is provided to the receive terminal RX. For example, the first coil 113 can serve to electrically connect the antenna terminal ANT and the receive terminal RX.

Further, the RF signal does not need to be transmitted through any transistors 120 and 130, and thus, there is little to no insertion loss introduced into the RF signal due to the transistors 120 and 130.

Figure 5:
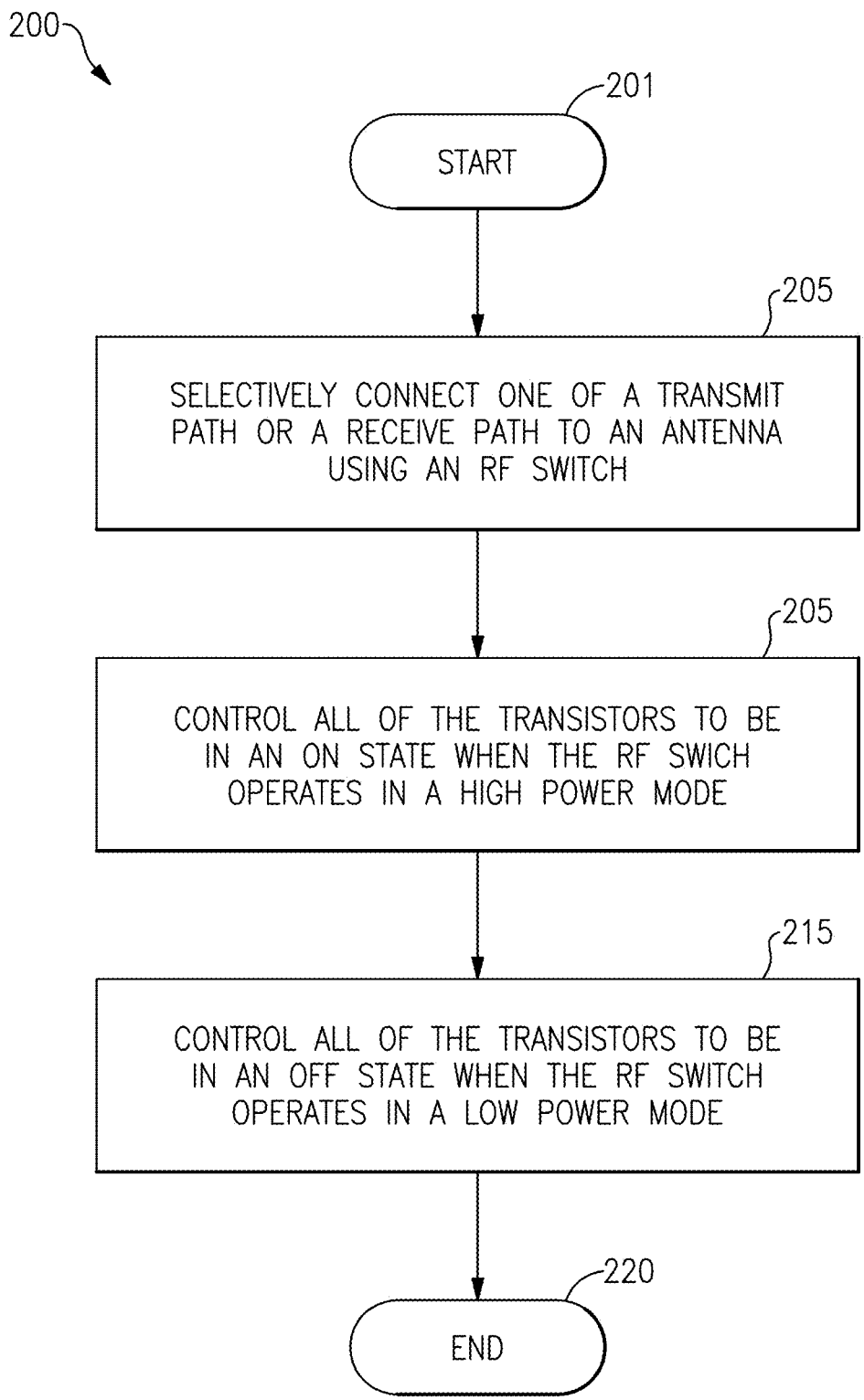
FIG. 5 illustrates a method of controlling an RF switch to provide low insertion loss in accordance with the teachings herein.

FIG. 5 illustrates a method of controlling an RF switch to provide low insertion loss in accordance with the teachings herein. The RF switch may be embodied as the RF switch 100 of FIGS. 4A-4C.

The method 200 begins at block 205. The method 200 involves selectively connecting one of a transmit path or a receive path to an antenna using the RF switch. The RF switch comprises a plurality of transistors, which may be connected as shown in FIG. 4A.

At block 210, the method 200 involves controlling all of the transistors to be in an on state when the RF switch operates in a high power mode. At block 215, the method 200 involves controlling all of the transistors to be in an off state when the RF switch operates in a low power mode. The method ends at block 220.

In some embodiments, the method 200 may further involve controlling an RF switch that includes a balun, such as the balun 110 of FIG. 4A. For instance, in one example the method further includes (i) in the low power mode providing an RF signal from an antenna terminal to a receive terminal through a first section of the balun; and (ii) in the high power mode inducing an RF signal at the antenna terminal in response to receiving a transmit signal at a transmit terminal coupled to a second section of the balun.

The method 200 may further involve electrically connecting the balun to ground in the high power mode as shown in FIG. 4B and electrically isolating the balun from ground in the low power mode as shown in FIG. 4C. In certain embodiments, the method 200 may further involve electrically connecting the antenna to the transmit path in the high power mode as shown in FIG. 4B and electrically connecting the antenna to the receive path in low power mode as shown in FIG. 4C.

Figure 6A:
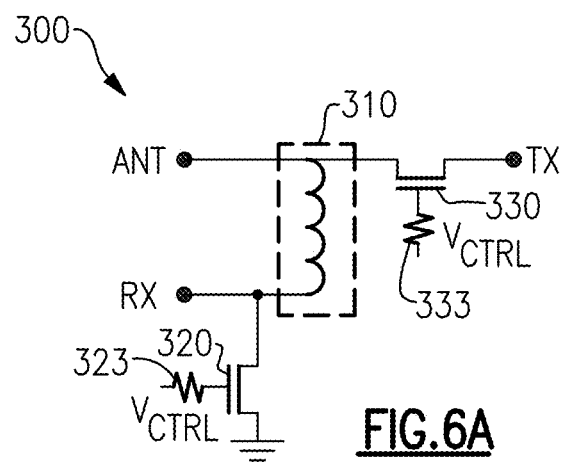
FIG. 6A illustrates another example implementation of a transmit/receive switch that can be used in the RF systems illustrated in FIGS. 1, 2A, and 2B in accordance with the teachings herein.
Figure 6B:
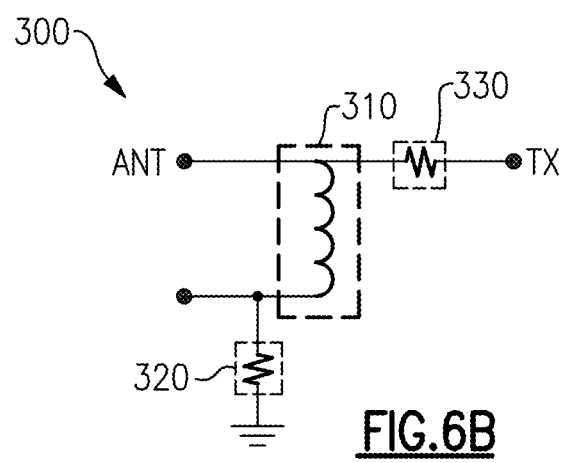
FIG. 6B illustrates the transmit/receive switch of FIG. 6A in a first mode.
Figure 6C:
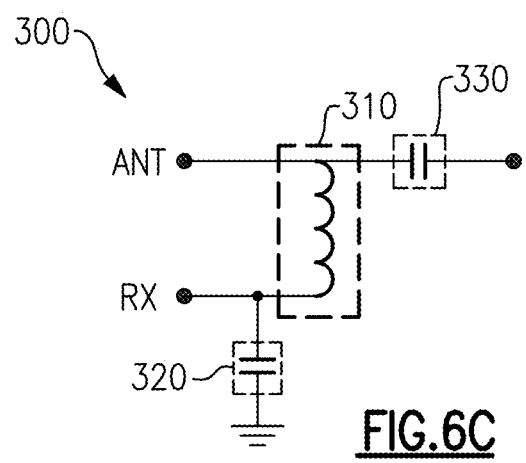
FIG. 6C illustrates the transmit/receive switch of FIG. 6A in a second mode.

FIGS. 6A-6C illustrate yet another example implementation of a transmit/receive switch 300 that can be used in the RF systems illustrated in FIGS. 1, 2A, and 2B in accordance with the teachings herein. Although the RF systems of FIGS. 1, 2A, and 2B illustrate examples of RF systems that can include one or more instantiations of the transmit/receive switch 300, the teachings herein are applicable to other configurations of RF systems.

With reference to FIG. 6A, the transmit/receive switch 300 includes an antenna terminal ANT, a transmit terminal TX, a receive terminal RX, an inductor 310, a first transistor 320, and a second transistor 330. The transmit/receive switch 300 further includes a first resistor 323 and a second resistor 333.

In the illustrated embodiment, a first end of the inductor 310 is electrically connected to the antenna terminal ANT and the second transistor 330 which is connected to the transmit terminal TX. A second end of the inductor 310 is electrically connected to the receive terminal RX and the first transistor 320 which is connected to a reference voltage (ground, in this example).

Although depicted as including a single transistor between the second end of the inductor 310 and ground and a single transistor between the first end of the inductor 310 and the transmit terminal TX, additional transistors can be included. For example, two or more transistors can be included in series between the second end of the inductor 310 and ground and/or two or more transistors can be included in series between the first end of the inductor 310 and the transmit terminal TX.

The first transistor 320 is configured to selectively connect the receive terminal RX and the second end of the inductor 310 to ground. Similarly, the second transistor 330 is configured to selectively connect the antenna terminal ANT and the first end of the inductor 310 to the transmit terminal TX.

In certain implementations, the first transistor 320 and the second transistor 330 are implemented as metal oxide semiconductor (MOS) transistors, such as n-type metal oxide semiconductor (NMOS) transistors. Additionally, a gate of the first transistor 320 and a gate of the second transistor 330 are controlled using a common control signal $V_{CTRL}$ from a control circuit (not shown in FIG. 6A). In such implementations, complexity of signaling of the transmit/receive switch 300 is reduced relative to implementation in which multiple control signals are used, such as pairs of logically inverted control signals.

In certain implementations, the first transistor 320 and the second transistor 330 are turned on or off based on data received over a chip interface. For example, the transmit/receive switch 300 can be fabricated on a semiconductor die that includes a serial bus that receives data for controlling the mode of the transmit/receive switch 300.

FIG. 6B illustrates the transmit/receive switch 300 when configured in a high power mode (e.g., RF transmit mode). As shown in FIG. 6B, each of the first and second transistors 320 and 330 is turned on in the high power mode, effectively connecting the second end of the inductor 310 to ground and the first end of the inductor 310 to the transmit terminal TX. As illustrated in the FIG. 6B embodiment, the first and second transistors 320 and 330 may have an on resistance $R_{ON}$ when turned on.

In particular, turning on the first transistor 320 and the second transistor 330 results in the transmit terminal TX being connected to the antenna terminal ANT through the second transistor 330 and the receiver terminal RX being connected to ground through the first transistor 320. The inductor 310 and the resistance formed by the first transistor 320 form an LC resonant circuit. The first transistor 320 may be configured to have on resistance $R_{ON}$ selected to form a resonant circuit that matches a transmit parasitic value of the transmit terminal TX. As shown in FIG. 6B, the transmit RF signal is provided to the antenna terminal ANT through the turned on second transistor 330. When operating in the high power mode, the receive terminal RX is grounded by the first transistor 320, thereby providing high isolation.

Since all of the transistors 320 and 330 in the high power mode are in an on state, a fewer number transistor 320 and 330 stacks are required in comparison to the embodiment of FIG. 3. With fewer stacked transistors 320 and 330, the insertion loss when operating in low power receive mode can be reduced. In addition, wide channel transistors need not be used to address insertion loss, thereby increasing the bandwidth of the transmit/receive switch 300.

FIG. 6C illustrates the transmit/receive switch 300 when configured in a low power mode (e.g., RF receive mode). As shown in FIG. 6C, each of the first and second transistors 320 and 330 is turned off in the low power mode, effectively electrically isolating the receive terminal RX from ground and effectively isolating the transmit terminal RX from the antenna terminal ANT. The amount of electrical isolation provided by the first and second transistors 320 and 330 may be a function of the off capacitance $C_{OFF}$ of the first and second transistors 320 and 330.

In particular, the transmit terminal TX is electrically isolated from the antenna terminal ANT such that current is not provided to the transmit terminal TX. The receive terminal RX is also electrically isolated from ground such that the RF signal received from the antenna ANT is provided to the receive terminal RX.

Further, the RF signal does not need to be transmitted through any transistors 320 and 330, and thus, there is little to no insertion loss introduced into the RF signal due to the transistors 320 and 330.

Applications

Devices employing the above described schemes can be implemented into various electronic systems. Examples of the electronic systems can include, but are not limited to, consumer electronic products, parts of the consumer electronic products, electronic test equipment, communication infrastructure applications, etc. Further, the electronic systems can include unfinished products, including those for communication, industrial, medical and automotive applications.

CONCLUSION

The foregoing description may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while the disclosed embodiments are presented in a given arrangement, alternative embodiments may perform similar functionalities with different components and/or circuit topologies, and some elements may be deleted, moved, added, subdivided, combined, and/or modified. Each of these elements may be implemented in a variety of different ways. Any suitable combination of the elements and acts of the various embodiments described above can be combined to provide further embodiments. Accordingly, the scope of the present invention is defined only by reference to the appended claims.

Although the claims presented here are in single dependency format for filing at the USPTO, it is to be understood that any claim may depend on any preceding claim of the same type except when that is clearly not technically feasible.

What is claimed is:

1. A radio frequency (RF) switch with low insertion loss, the RF switch comprising:
    a plurality of terminals including an antenna terminal, a receive terminal, and a transmit terminal;
    a plurality of transistors that are controllable to set the RF switch in a first mode or a second mode; and
    a balun comprising a plurality of terminals, wherein at least two of the transistors of the plurality of transistors are electrically connected to different terminals of the balun,
    wherein the RF switch is configured to connect the transmit terminal to the antenna terminal in the first mode, and to connect the antenna terminal to the receive terminal in the second mode,
    wherein all of the transistors are configured to be in an on state when the RF switch operates in the first mode and all of the transistors are configured to be in an off state when the RF switch operates in the second mode.

2. The RF switch of claim 1, wherein the balun is electrically connected to each of the antenna terminal, the transmit terminal, and the receive terminal.

3. The RF switch of claim 1, wherein the transmit terminal is configured to handle an RF transmit signal having a voltage that is greater than a breakdown voltage of each of the transistors.

4. The RF switch of claim 1, wherein the balun comprises:
    a first loop, and
    a second loop magnetically coupled to the first loop,
    wherein a first terminal of the first loop is electrically connected to the antenna terminal and a second terminal of the first loop is electrically connected to the receive terminal, and
    wherein a first terminal of the second loop is electrically connected to the transmit terminal.

5. The RF switch of claim 4, wherein the plurality of transistors comprise:
    a first transistor including a drain electrically connected to the receive terminal and a source electrically connected to a reference voltage, and
    a second transistor including a drain electrically connected to a second terminal of the second loop and a source electrically connected to the reference voltage.

6. The RF switch of claim 5, wherein each of the first and second transistors is configured to electrically connect the balun to the reference voltage in the first mode and electrically isolate the balun from the reference voltage in the second mode.

7. The RF switch of claim 5, wherein the first transistor is configured to connect the receive terminal to the reference voltage in the first mode.

8. The RF switch of claim 5, fabricated on a semiconductor die.

9. An RF system comprising the RF switch of claim 1, wherein the RF system further comprises:
    an antenna;
    a transmit path configured to generate a transmit signal for the antenna; and
    a receive path configured to process a receive signal from the antenna, wherein the RF switch is configured to provide the receive signal from the antenna to the receive path in the second mode, and wherein the RF switch is configured to provide the transmit signal from the transmit path to the antenna in the first mode.

10. The RF system of claim 9, further comprising a circulator and a termination impedance, wherein the RF switch is configured to electrically connected the termination impedance to a receive terminal of the circulator in the first mode.

11. A radio frequency (RF) switch with low insertion loss, the RF switch comprising:
   a plurality of terminals including an antenna terminal, a receive terminal, and a transmit terminal;
   a plurality of transistors that are controllable to set the RF switch in a first mode or a second mode; and
   a balun electrically connected to each of the antenna terminal, the transmit terminal, and the receive terminal, wherein the balun comprises:
      a first loop electrically connected between the antenna terminal and the receive terminal, and
      a second loop electrically connected to the transmit terminal,
   wherein the RF switch is configured to connect the transmit terminal to the antenna terminal in the first mode, and to connect the antenna terminal to the receive terminal in the second mode,
   wherein all of the transistors are configured to be in an on state when the RF switch operates in the first mode and all of the transistors are configured to be in an off state when the RF switch operates in the second mode.

12. An RF system comprising the RF switch of claim 11, wherein the RF system further comprises:
   an antenna;
   a transmit path configured to generate a transmit signal for the antenna; and
   a receive path configured to process a receive signal from the antenna,
   wherein the RF switch is configured to provide the receive signal from the antenna to the receive path in the second mode, and wherein the RF switch is configured to provide the transmit signal from the transmit path to the antenna in the first mode.

13. The RF system of claim 12, further comprising a circulator and a termination impedance, wherein the RF switch is configured to electrically connected the termination impedance to a receive terminal of the circulator in the first mode.

14. The RF switch of claim 11, wherein the transmit terminal is configured to handle an RF transmit signal having a voltage that is greater than a breakdown voltage of each of the transistors.

15. The RF switch of claim 11, wherein the plurality of transistors comprise:
   a first transistor including a drain electrically connected to the receive terminal and a source electrically connected to a reference voltage, and
   a second transistor including a drain electrically connected to a second terminal of the second loop and a source electrically connected to the reference voltage.

16. The RF switch of claim 15, wherein each of the first and second transistors is configured to electrically connect the balun to the reference voltage in the first mode and electrically isolate the balun from the reference voltage in the second mode.

17. The RF switch of claim 15, wherein the first transistor is configured to connect the receive terminal to the reference voltage in the first mode.

18. A method of controlling a radio frequency (RF) switch to provide low insertion loss, the method comprising:
   selectively connecting one of a transmit path or a receive path to an antenna using an RF switch, the RF switch comprising a plurality of transistors and a balun;
   controlling all of the transistors to be in an on state when the RF switch operates in a high power mode;
   controlling all of the transistors to be in an off state when the RF switch operates in a low power mode;
   electrically connecting the antenna to the receive path through a first coil of the balun in the low power mode; and
   inducing an RF signal at the antenna in response to receiving a transmit signal at a second coil of the balun in the high power mode.

19. The method of claim 18, wherein the method further comprises:
   electrically connecting the balun to a reference voltage in the high power mode; and
   electrically isolating the balun from the reference voltage in the low power mode.

20. The method of claim 18, further comprising:
   electrically connecting the antenna to the transmit path in the high power mode; and
   electrically connecting the antenna to the receive path in low power mode.

* * * * *